US008545974B2

(12) United States Patent
Creasy, Jr.

(10) Patent No.: US 8,545,974 B2
(45) Date of Patent: Oct. 1, 2013

(54) FLAME RETARDANT EMI SHIELDS

(75) Inventor: Larry D Creasy, Jr., St. Clair, MO (US)

(73) Assignee: Laird Technologies, Inc., Earth City, MO (US)

( * ) Notice: Subject to any disclaimer, the term of this patent is extended or adjusted under 35 U.S.C. 154(b) by 1091 days.

(21) Appl. No.: 11/143,333

(22) Filed: Jun. 2, 2005

(65) Prior Publication Data
US 2007/0011693 A1 Jan. 11, 2007

Related U.S. Application Data

(60) Provisional application No. 60/651,252, filed on Feb. 9, 2005.

(51) Int. Cl.
*B32B 7/12* (2006.01)
(52) U.S. Cl.
USPC ............... 428/317.1; 428/343; 428/304.4; 428/920; 428/921; 720/650; 361/818
(58) Field of Classification Search
USPC ............................................. 720/650
See application file for complete search history.

(56) References Cited

U.S. PATENT DOCUMENTS

| | | | |
|---|---|---|---|
| 3,686,067 A | 8/1972 | Williams | |
| 3,736,457 A | 5/1973 | Cullen et al. | |
| 3,764,577 A | 10/1973 | Burns et al. | |
| 4,046,742 A | 9/1977 | Eimers et al. | |
| 4,076,654 A * | 2/1978 | Yukuta et al. | 521/106 |
| 4,288,081 A | 9/1981 | Sado | |
| 4,451,586 A | 5/1984 | Searl et al. | |
| 4,542,170 A | 9/1985 | Hall et al. | |
| 4,556,536 A * | 12/1985 | Novotny | 422/7 |
| 4,587,273 A | 5/1986 | Shimomura | |
| 4,594,472 A | 6/1986 | Brettle et al. | |
| 4,636,536 A | 1/1987 | Kamiyo et al. | |
| 4,678,863 A | 7/1987 | Reese et al. | |
| 4,698,369 A | 10/1987 | Bell | |
| 4,717,509 A | 1/1988 | Buttgens et al. | |
| 4,722,945 A | 2/1988 | Wood et al. | |
| 4,740,527 A | 4/1988 | von Bonin | |
| 4,857,668 A | 8/1989 | Buonanno | |
| 4,965,296 A | 10/1990 | Hastings | |
| 4,980,223 A * | 12/1990 | Nakano et al. | 428/198 |
| 5,023,280 A | 6/1991 | Haas et al. | |
| 5,045,635 A | 9/1991 | Kaplo et al. | |
| 5,182,163 A | 1/1993 | Wheat et al. | |
| 5,213,520 A | 5/1993 | Casey et al. | |
| 5,851,663 A | 12/1998 | Parsons et al. | |
| 5,910,524 A | 6/1999 | Kalinoski | |
| 6,011,504 A | 1/2000 | Tan | |
| 6,119,305 A | 9/2000 | Loveall et al. | |
| 6,248,393 B1 | 6/2001 | Bunyan et al. | |
| 6,252,167 B1 | 6/2001 | Rose | |
| 6,309,742 B1 | 10/2001 | Clupper et al. | |
| 6,387,523 B2 | 5/2002 | Bunyan | |
| 6,388,893 B1 | 5/2002 | Calderon | |
| 6,399,880 B1 | 6/2002 | Bedrosian et al. | |
| 6,410,137 B1 * | 6/2002 | Bunyan | 428/356 |
| 6,465,731 B1 | 10/2002 | Miska | |
| 6,521,348 B2 | 2/2003 | Bunyan et al. | |
| 6,544,596 B2 | 4/2003 | Clemens et al. | |
| 6,548,590 B1 | 4/2003 | Koloski et al. | |
| 6,716,536 B2 | 4/2004 | Bunyan et al. | |
| 6,723,916 B2 | 4/2004 | Flaherty et al. | |
| 6,777,095 B2 | 8/2004 | Bunyan et al. | |
| 6,784,363 B2 | 8/2004 | Jones | |
| 6,809,129 B2 | 10/2004 | Abu-Isa | |
| 6,943,288 B1 | 9/2005 | Miska | |
| 6,953,889 B2 | 10/2005 | Hanks | |
| 7,060,348 B2 | 6/2006 | Creasy et al. | |
| 7,105,234 B2 | 9/2006 | Miska | |
| 2002/0010223 A1 | 1/2002 | Botrie | |
| 2002/0129953 A1 | 9/2002 | Miska | |
| 2002/0142684 A1 | 10/2002 | Miska | |
| 2003/0036326 A1 | 2/2003 | Takagi et al. | |
| 2003/0059607 A1 | 3/2003 | Schumann et al. | |
| 2003/0098440 A1 * | 5/2003 | Musa et al. | 252/182.13 |
| 2003/0099828 A1 * | 5/2003 | Bundo et al. | 428/352 |
| 2003/0173100 A1 | 9/2003 | Flaherty et al. | |
| 2003/0236362 A1 | 12/2003 | Bluem et al. | |
| 2004/0012003 A1 | 1/2004 | Tabushi et al. | |
| 2004/0019143 A1 | 1/2004 | Koloski et al. | |

(Continued)

FOREIGN PATENT DOCUMENTS

| | | |
|---|---|---|
| CA | 2318620 | 9/1999 |
| EP | 0 917 419 | 5/1999 |

(Continued)

OTHER PUBLICATIONS

Toshihiro, Yamamoto, "Conductive Porous Material Having Falme Retardance and Method for Manufacturing Same", English translation of JP 2002-030177, Jan. 31, 2002.*
U.S. Appl. No. 60/653,395, filed Feb. 16, 2005, Cloutier et al, Bromine-Free EMI Shielding Gasket and Materials Therefor.
Bostik Technical Data Sheet, 340 Film Adhesive, Apr. 2005, 1 page, www.bostik-us.com.
Interrogatory from Japanese Appeal Board from Japanese patent application No. 2007-515709; dated Aug. 2, 2011; 2 pages; Japanese patent application No. 2007-515709 is a national phase application of PCT/US2005/028352 (now published as WO 2006/115528) which claims priority to the instant application.
Notification of Reason for Rejection (Office Action) dated Jun. 12, 2012, for Japanese patent application No. 2007-515709; 17 pages. Japanese patent application No. 2007-515709 is a national phase application of PCT/US2005/028352 (now published as WO 2006/115528) which claims priority to the instant application.
New Sculpted Foam UL94 VO Fabric-Over Foam, Aug. 2004, 2 pages.

*Primary Examiner* — Callie Shosho
*Assistant Examiner* — Anish Desai
(74) *Attorney, Agent, or Firm* — Harness, Dickey & Pierce, P.L.C.

(57) ABSTRACT

An electromagnetic interference shield generally includes a resilient core member and an electrically conductive layer. An adhesive bonds the electrically conductive layer to the resilient core member. The adhesive can include halogen-free flame retardant. The electrically conductive layer can be provided with halogen-free flame retardant and/or a corrosion inhibitor.

39 Claims, 6 Drawing Sheets

(56) References Cited

U.S. PATENT DOCUMENTS

| | | |
|---|---|---|
| 2004/0142616 A1 | 7/2004 | Bunyan et al. |
| 2004/0157955 A1 | 8/2004 | Creasy et al. |
| 2004/0209064 A1 | 10/2004 | Kaplo |
| 2004/0209065 A1 | 10/2004 | Kaplo |
| 2004/0231872 A1 | 11/2004 | Arnold et al. |
| 2005/0059754 A1 | 3/2005 | Lunt et al. |
| 2005/0167133 A1 | 8/2005 | Aisenbrey |
| 2005/0167931 A1 | 8/2005 | Aisenbrey |
| 2005/0256234 A1 | 11/2005 | Kurumatani et al. |
| 2006/0086520 A1 | 4/2006 | Romano |
| 2006/0180348 A1 | 8/2006 | Cloutier et al. |
| 2006/0182877 A1 | 8/2006 | Creasy |
| 2009/0068907 A1 | 3/2009 | Sakagawa et al. |

FOREIGN PATENT DOCUMENTS

| | | |
|---|---|---|
| EP | 0992557 | 4/2000 |
| EP | 1057387 | 12/2000 |
| EP | 1094257 | 4/2001 |
| JP | 2002-125730 A | 5/1990 |
| JP | 2641561 | 8/1997 |
| JP | 11-4094 | 1/1999 |
| JP | 2000-109769 | 4/2000 |
| JP | 2001-11774 | 1/2001 |
| JP | 2001052537 | 2/2001 |
| JP | 2001-199025 | 7/2001 |
| JP | 2001226570 A | 8/2001 |
| JP | 2002-030177 | 1/2002 |
| JP | 2002505528 | 2/2002 |
| JP | 2002-121508 | 4/2002 |
| JP | 2002-188065 | 7/2002 |
| JP | 2002-198679 A | 7/2002 |
| JP | 2003-003144 | 1/2003 |
| JP | 2003-096427 | 4/2003 |
| JP | 2003115695 A | 4/2003 |
| JP | 2003-188574 | 7/2003 |
| JP | 2003-243873 A | 8/2003 |
| JP | 2003-247164 A | 9/2003 |
| JP | 2003-258480 A | 9/2003 |
| JP | 2003-336027 | 11/2003 |
| JP | 2004-211247 A | 7/2004 |
| JP | 2004231792 | 8/2004 |
| JP | 2004-263030 | 9/2004 |
| JP | 2004253766 | 9/2004 |
| JP | 2005133054 | 5/2005 |
| TW | 446635 B | 7/2001 |
| TW | I306470 | 2/2009 |
| WO | WO 95/02953 | 1/1995 |
| WO | WO 95/07603 | 3/1995 |
| WO | WO 99/18765 | 4/1999 |
| WO | WO 99/44406 | 9/1999 |
| WO | WO 01/10182 | 2/2001 |
| WO | WO 01/62061 | 8/2001 |
| WO | WO 03/077627 | 9/2003 |
| WO | WO 2005017060 A1 | 2/2005 |
| WO | WO 2006022463 A1 | 3/2006 |
| WO | WO 2006/112539 | 10/2006 |

* cited by examiner

BOND STRENGTH OF ADHESIVE WITH ABOUT 63% FR

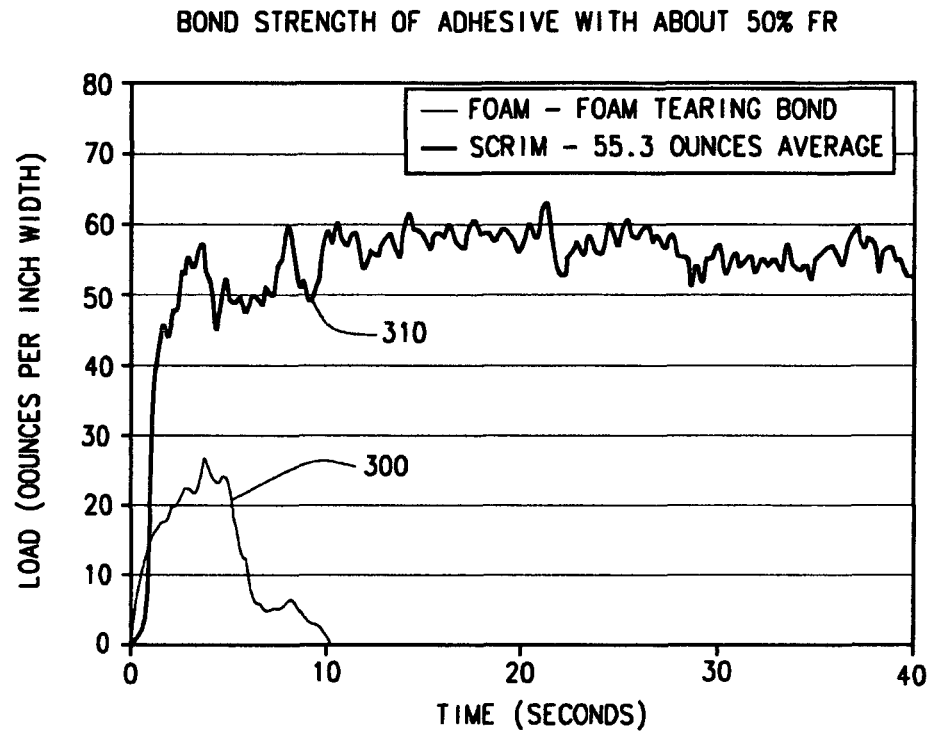

FIG. 3

| FABRIC | COATING WEIGHT (OPSY) | OVERALL WEIGHT (OPSY) | SURFACE RESISTIVITY (OHMS/SQ) | UL94 HB BURN |
|---|---|---|---|---|
| NRS UNCOATED | — | 2.36 | 0.034 | — |
| NRS COATED (START OF PRODUCTION RUN) | 0.27 | 2.63 | 0.034 | PASSED HB |
| NRS COATED (END OF PRODUCTION RUN) | 0.27 | 2.63 | 0.036 | PASSED HB |
| MESH UNCOATED | — | 1.71 | 0.069 | — |
| MESH COATED (START OF PRODUCTION RUN) | 0.26 | 1.97 | 0.075 | PASSED HB |
| MESH COATED (END OF PRODUCTION RUN) | 0.33 | 2.04 | 0.087 | PASSED HB |
| TAFFETA UNCOATED | — | 2.55 | 0.036 | — |
| TAFFETA COATED (START OF PRODUCTION RUN) | 0.16 | 2.71 | 0.029 | FAILED HB |
| TAFFETA COATED (END OF PRODUCTION RUN) | 0.20 | 2.75 | 0.039 | FAILED HB |

FIG. 4

CRUSH AND FOLD ABUSE TEST

|  | NRS WITH NON-FR URETHANE | | NRS WITH FR URETHANE | |
|---|---|---|---|---|
| CYCLES | SURFACE RESISTIVITY (OHMS/SQ) | SHIELDING EFFECTIVENESS (DECIBELS) | SURFACE RESISTIVITY (OHMS/SQ) | SHIELDING EFFECTIVENESS (DECIBELS) |
| 0 | 0.0294 | 82 | 0.0312 | 75 |
| 5 | 0.0473 |  | 0.0586 |  |
| 10 | 0.0965 | 74 | 0.1179 | 69 |
| 15 | 0.2072 |  | 0.2344 | 63 |
| 20 | 0.3699 | 63 | 0.4693 | 59 |
| 25 | 0.6549 | 60 | 0.8343 | 54 |
| 30 | 0.8349 | 56 |  |  |

FLAME RETARDANT EMI SHIELDS

CROSS-REFERENCE TO RELATED APPLICATION

This application claims priority to U.S. Provisional Application 60/651,252, filed Feb. 9, 2005, the entire disclosure of which is incorporated herein by reference.

FIELD OF THE INVENTION

The present invention generally relates to electromagnetic interference (EMI) shielding, and more particularly (but not exclusively) to flame retardant fabric-over-foam EMI shields formed from environmentally friendly materials, such as halogen-free flame retardants.

BACKGROUND OF THE INVENTION

The operation of electronic devices generates electromagnetic radiation within the electronic circuitry of the equipment. Such radiation results in electromagnetic interference (EMI), which can interfere with the operation of other electronic devices within a certain proximity. A common solution to ameliorate the effects of EMI has been the development of shields capable of absorbing and/or reflecting EMI energy. These shields are typically employed to localize EMI within its source, and to insulate other devices proximal to the EMI source.

SUMMARY OF THE INVENTION

According to one aspect of the present invention, an EMI shield generally includes a resilient core member and an electrically conductive layer. An adhesive bonds the electrically conductive layer to the resilient core member. The adhesive includes halogen-free flame retardant. In various embodiments, the electrically conductive layer can be provided with halogen-free flame retardant and/or a corrosion inhibitor.

In another aspect, the invention provides methods of making EMI shields. In one exemplary implementation, the method generally includes applying halogen-free flame retardant and/or a corrosion inhibitor to an electrically conductive layer, and bonding the electrically conductive layer to a resilient core member with an adhesive including halogen-free flame retardant.

Further aspects of the present invention will become apparent from the detailed description provided hereinafter. It should be understood that the detailed description and specific examples, while indicating various embodiments and methods of the invention, are for illustration purposes only and are not intended to limit the scope of the invention.

BRIEF DESCRIPTION OF THE DRAWINGS

The invention will become more fully understood from the detailed description and the accompanying drawings, wherein:

FIG. 3 is an exemplary line graph of load versus time showing bond strength of an adhesive that includes halogen-free flame retardant according to one exemplary embodiment of the present invention;

FIG. 4 is a table of exemplary fabrics that can be provided with halogen-free flame retardant according to various exemplary embodiments of the present invention;

DETAILED DESCRIPTION OF THE EXEMPLARY EMBODIMENTS

Figure 1:
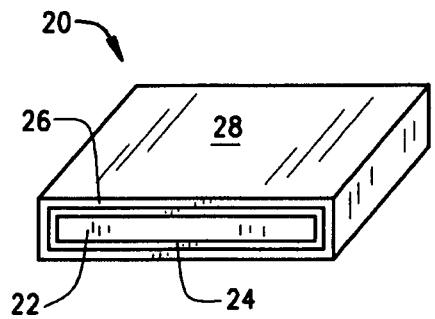
FIG. 1 is a perspective view of an EMI shield according to one exemplary embodiment of the present invention.

The following description of the exemplary embodiments is merely exemplary in nature and is in no way intended to limit the invention, its application, or uses.

According to various aspects, the invention provides electromagnetic interference (EMI) shields, such as EMI gaskets. In one embodiment, an EMI shield generally includes a resilient core member and an electrically conductive layer. The electrically conductive layer is provided with (e.g., coated, impregnated, combinations thereof, etc.) halogen-free flame retardant. An adhesive bonds the electrically conductive layer to the core member. The adhesive is loaded with an effective amount of halogen-free flame retardant, which in combination with the halogen-free flame retardant provided to the electrically conductive layer, enables the shield to achieve a predetermined flame retardant rating (e.g., a UL94 vertical flame rating of V0, etc.). The effective amount of halogen-free flame retardant in the adhesive, however, is less than a predetermined percentage below which the loaded adhesive provides at least a predetermined bond strength (e.g., at least about ten ounces per inch width as determined, for example, by a one hundred eighty degree peel test at twelve inches per minute, etc.). Accordingly, this particular embodiment of the EMI shield is halogen-free and environmentally friendly.

In another embodiment, an EMI shield generally includes a resilient core member and an electrically conductive layer. The electrically conductive layer is bonded to the core member with an adhesive. In this particular embodiment, the adhesive is loaded with an effective amount of halogen-free flame retardant such that the shield can achieve a predetermined flame retardant rating (e.g., a UL94 vertical flame rating of V0, etc.) without flame retardant being provided to the electrically conductive layer. The effective amount of halogen-free flame retardant in the adhesive, however, is less than a predetermined percentage below which the loaded adhesive provides at least a predetermined bond strength (e.g., at least about ten ounces per inch width as determined, for example, by a one hundred eighty degree peel test at twelve inches per minute, etc.). Accordingly, this particular embodiment of the EMI shield is halogen-free and environmentally friendly.

In a further embodiment, an EMI shield generally includes a resilient core member and an electrically conductive layer. An adhesive, which includes halogen-free flame retardant, bonds the electrically conductive layer to the core member. In this particular embodiment, the electrically conductive layer is provided with (e.g., coated, impregnated, combinations thereof, etc.) a halogen-free corrosion inhibitor (e.g., benzotriazole, or other suitable corrosion inhibitor, for example, from the azole family and/or pyrole family, etc.). The corrosion inhibitor can also function as a flame retardant, which in combination with the flame retardant properties of the adhesive enables the shield to achieve a predetermined flame retardant rating (e.g., a UL94 vertical flame rating of V0, etc.). The effective amount of halogen-free flame retardant in the adhesive, however, is less than a predetermined percentage below which the loaded adhesive provides at least a predetermined bond strength (e.g., at least about ten ounces per inch width as determined, for example, by a one hundred eighty degree peel test at twelve inches per minute, etc.). Accordingly, this particular embodiment of the EMI shield is halogen-free and environmentally friendly.

Other aspects of the invention methods of making and using EMI shields. Further aspects of the invention include adhesives loaded with halogen-free flame retardant. Additional aspects of the invention include electrically conductive materials (e.g., nylon ripstop (NRS) fabrics, mesh fabrics, taffeta fabrics, woven fabrics, non-woven fabrics, knitted fabrics, etc.) that are provided with (e.g., coated, impregnated, combinations thereof, etc.) halogen-free flame retardants and/or corrosion inhibitors. Further aspects include EMI shields in which the electrically conductive layer is not provided with flame retardant or a corrosion inhibitor.

FIG. 1 illustrates an exemplary EMI shield 20 in accordance with principles of the present invention. As shown, the shield 20 includes a resilient core member 22, an electrically conductive layer 26 generally surrounding the resilient core member 22, and an adhesive 24 bonding the electrically conductive layer 26 to the resilient core member 22. The electrically conductive layer 26 can be provided (e.g., coated, impregnated, combinations thereof, etc.) with halogen-free flame retardant and/or a halogen-free corrosion inhibitor (which may also function as and thus be referred to herein as a flame retardant). In the illustrated embodiment, the electrically conductive layer 26 is provided a coating 28 that includes halogen-free flame retardant and urethane. In addition to, or as an alternative, to the flame retardant, the coating 28 can include a corrosion inhibitor such as benzotriazole or other suitable corrosion inhibitors, for example, selected from the azole family and/or pyrole family. In various embodiments, the corrosion inhibitor may have flame retardant properties, in which case, the coating need not include any other flame retardants besides the corrosion inhibitor.

A wide range of materials can be used for the resilient core member 22. In one embodiment, the resilient core member 22 is made of urethane foam having a polyester film scrim attached thereto. Alternatively, other materials can be used for the resilient core member, such as other resiliently compressible materials that are suitable for compression within an opening. Other materials and types can also be used for the scrim including fabrics. Yet other embodiments do not have a scrim attached to the resilient core member.

A wide range of materials can be used for the electrically conductive portion 26. Exemplary materials include conductive fillers within a layer, a metal layer, and/or a conductive non-metal layer. In some embodiments, the electrically conductive portion 26 comprises a metallized or plated fabric in which the metal is copper, nickel, silver, palladium aluminum, tin, alloys, and/or combinations thereof. For example, one particular embodiment includes a nickel copper nylon ripstop (NRS) fabric. In other embodiments, the electrically conductive portion 26 may comprise a layer of material that is impregnated with a metal material to thereby render the layer sufficiently electrically conductive for EMI shielding applications. The particular material(s) used for the electrically conductive portion 26 may vary, for example, depending on the desired electrical properties (e.g., surface resistivity, electrical conductivity, etc.), which, in turn, can depend, for example, on the particular application in which the EMI shield will be used.

In various embodiments, the adhesive layer 24 is an environmentally safe adhesive suitable for providing good bond strength between the electrically conductive portion 26 and the resilient core member 22. The adhesive layer 24 can include a wide range of suitable adhesives. In one embodiment, the adhesive layer 24 includes a solvent based polyester adhesive that is loaded with an effective amount of flame retardant to enable the EMI shield to achieve a predetermined flame rating while at the same time having good bond strength and retaining properties suitable (e.g., shielding effectiveness, bulk resistivity, etc.) for EMI shielding applications.

Flame ratings can be determined using the Underwriters Laboratories Standard No. 94, "Tests for Flammability of Plastic Materials for Parts in Devices and Appliances" (5$^{th}$ Edition, Oct. 29, 1996) or using an ASTM (American Society for Testing and Materials) flammability test. In one embodiment, the adhesive layer 24 includes an effective amount of flame retardant such that the EMI shield 20 has a UL94 vertical flame rating of V0. In other embodiments, the adhesive layer may include less flame retardant (or lesser effective flame retardants) such that the EMI shield can only achieve a lower UL94 flame rating such as V1, V2, HB, or HF-1. The desired UL94 flame rating can depend, for example, on the particular application or installation for the EMI shield.

While the adhesive can include at least an effective amount of halogen-free flame retardant to achieve a predetermined flame rating, the adhesive can also include more than that effective amount. In various embodiments, the adhesive does not include more than a predetermined percentage by dry weight of the halogen-free flame retardant, below which percentage the adhesive provides at least a predetermined bond strength. As recognized by the inventor hereof, there is a delicate balance that should be maintained with the halogen-free flame retardant and the adhesive for some embodiments of the invention. If the adhesive contains too much halogen-free flame retardant, the bond strength can be compromised.

But if the adhesive does not include enough halogen-free flame retardant, then the EMI shield may not be able to meet the desired UL94 flame rating (e.g., V0, V1, V2, HB, HF-1, etc.). Accordingly, in various embodiment, the adhesive includes at least an effective amount of halogen-free flame retardant for providing the shield with a predetermined UL flame rating, but less than a predetermined percentage below which the adhesive provides at least a predetermined bond strength.

In various embodiments, the halogen-free flame retardant is a phosphorous-based flame retardant. In one embodiment, the adhesive includes an amount of halogen-free flame retardant of at least about thirty percent (+/−five percent) but not more than about seventy percent by dry weight. In another embodiment, the adhesive includes an amount of halogen-free flame retardant of at least about fifty percent but not more than about sixty-three percent by dry weight. In yet another embodiment, the adhesive includes an amount of halogen-free flame retardant of about sixty-three percent by dry weight. In still another embodiment, the adhesive includes an amount of halogen-free flame retardant of about fifty-five percent by dry weight. In a further embodiment, the adhesive includes an amount of halogen-free flame retardant of about fifty percent by dry weight. In various embodiments, the adhesive is formed into a layer that may be laminated in production of the EMI shield.

The adhesive may include any of a wide range of flame retardants, including environmentally friendly flame retardants that are substantially free or entirely free of halogens (e.g., bromines, chlorines, etc.). Particular examples of commercially available halogen-free phosphorous-based flame retardants are sold by Bostik, Inc. of Middleton, Mass. and Apex Chemical Company of Spartanburg, S.C. Other exemplary flame retardants that can be used include mineral oxides (e.g., magnesium hydroxide, antimony oxide, etc.), metal hydrates (e.g., aluminum trihydrate, etc.) boron compounds (e.g., boric acid, borax, etc.), melamines, and silicones.

The following non-limiting examples, flammability test results, tables (FIGS. 4 and 5), and line graphs (FIGS. 2, 3, and 6-12) help to illustrate various aspects of the EMI shields produced in accordance with principles of the invention. These examples are provided for purposes of illustration only and not for limitation.

For one particular series of tests, the test specimens included a commercially available Woodbridge four pound per cubic foot density urethane foam 0.125 inches thick by 0.5 inches wide. This foam was made in a layer thickness of 3.0 millimeters, which is suitable for a UL sample. The test specimens further included an electrically conductive metallized fabric material laminated to an adhesive layer. The adhesive layer included a polyester adhesive with about fifty-five percent by dry weight of a halogen-free phosphorous-based flame retardant. Specifically, the adhesive layer included 10-336 adhesive produced by Bostik, Inc. having a thickness of about 0.0025 inches. Aspects of the invention, however, are not limited to this particular type and kind of adhesive.

In this series of tests, the fabric was provided with urethane that did not include flame retardant (Non-FR urethane). The Non-FR urethane coating included about eighteen percent urethane solids such that the weight pick-up from the Non-FR urethane coating was about 0.15 ounces per square yard (opsy). Further, the fabric was laminated using a flat bed laminator set at two hundred sixty degrees Fahrenheit at approximately fifteen feet per minute (although other suitable means can also be employed). The fabric and adhesive layer may also be trimmed to any suitable size or shape.

The foam was joined together with the fabric and adhesive layer using a series of heated dies to form the shield in the desired shape. Samples of this shield embodiment having dimensions of approximately 3.0 millimeters thick by 12.5 millimeters wide by 125 millimeters long were then tested per the UL94 flame rating of V0. The exemplary flammability test results are set forth below in Table 1 for purposes of illustration only.

TABLE 1

| Sample | T1 | T2 | T3 | Result |
|--------|----|----|----|--------|
| 1 | 6 | 0 | 0 | V0 |
| 2 | 5 | 0 | 0 | V0 |
| 3 | 7 | 0 | 0 | V0 |
| 4 | 8 | 0 | 0 | V0 |
| 5 | 5 | 1 | 0 | V0 |

Total Afterflame 32

As shown in Table 1 above, this particular embodiment of the EMI shield included at least an effective amount of halogen-free flame retardant within the adhesive to provide the shield with a UL94 flame rating of V0.

Figure 12:
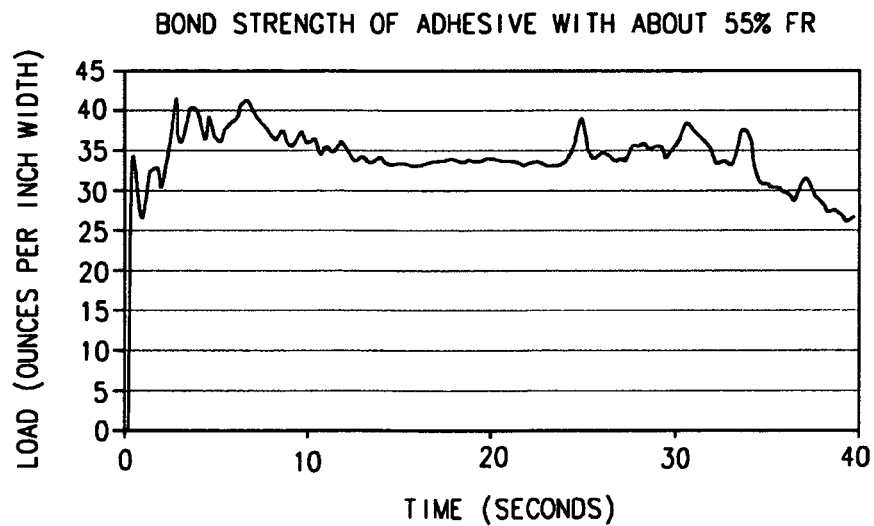
FIG. 12 is an exemplary line graph of load versus time showing bond strength of an adhesive that includes halogen-free flame retardant according to one exemplary embodiment of the present invention.

FIG. 12 illustrates the bonding strength of this particular adhesive (having about fifty-five percent by dry weight of a halogen-free phosphorous-based flame retardant) between the metallized fabric and a one-millimeter thick polyester film scrim. The averaging bonding strength of this particular adhesive between the metallized fabric and scrim was about thirty-five ounces per inch width. The desired bonding strength, however, can vary depending, for example, on the particular application in which the EMI shield will be used.

For another series of tests, the test specimens included a commercially available Woodbridge four pound per cubic foot density urethane foam 0.125 inches thick by 0.5 inches wide. This foam was made in a layer thickness of 3.0 millimeters, which is suitable for a UL sample. The test specimens further included an electrically conductive metallized fabric material laminated to an adhesive layer. The adhesive layer included a polyester adhesive (e.g., 10-335 adhesive produced by Bostik, Inc., etc.) with about sixty-three percent by dry weight of a halogen-free phosphorous-based flame retardant.

In this series of tests, the fabric was not provided with a flame retardant. Further, the fabric was laminated using a flat bed laminator set at two hundred sixty degrees Fahrenheit at approximately fifteen feet per minute (although other suitable means can also be employed). The fabric and adhesive layer may also be trimmed to any suitable size or shape.

The foam was joined together with the fabric and adhesive layer using a series of heated dies to form the shield in the desired shape. Samples of this shield embodiment having dimensions of approximately 3.0 millimeters thick by 12.5 millimeters wide by 125 millimeters long were then tested per the UL94 flame rating of V0. The exemplary flammability test results are set forth below in Table 2 for purposes of illustration only.

TABLE 2

| Sample | T1 | T2 | T3 | Result |
|--------|----|----|----|--------|
| 1 | 9 | 0 | 0 | V0 |
| 2 | 4 | 2 | 3 | V0 |
| 3 | 14 | 0 | 3 | V1 |
| 4 | 6 | 1 | 3 | V0 |
| 5 | 9 | 1 | 3 | V0 |

TABLE 2-continued

| Sample | T1 | T2 | T3 | Result |
|---|---|---|---|---|

Total Afterflame 46

As shown in Table 2, this particular embodiment of the EMI shield included at least an effective amount of halogen-free flame retardant within the adhesive to provide the shield with a UL94 flame rating of V1. These flammability results may be suitable for some applications as the desired flame rating can vary depending, for example, on the particular application in which the EMI shield will be used.

Figure 2:
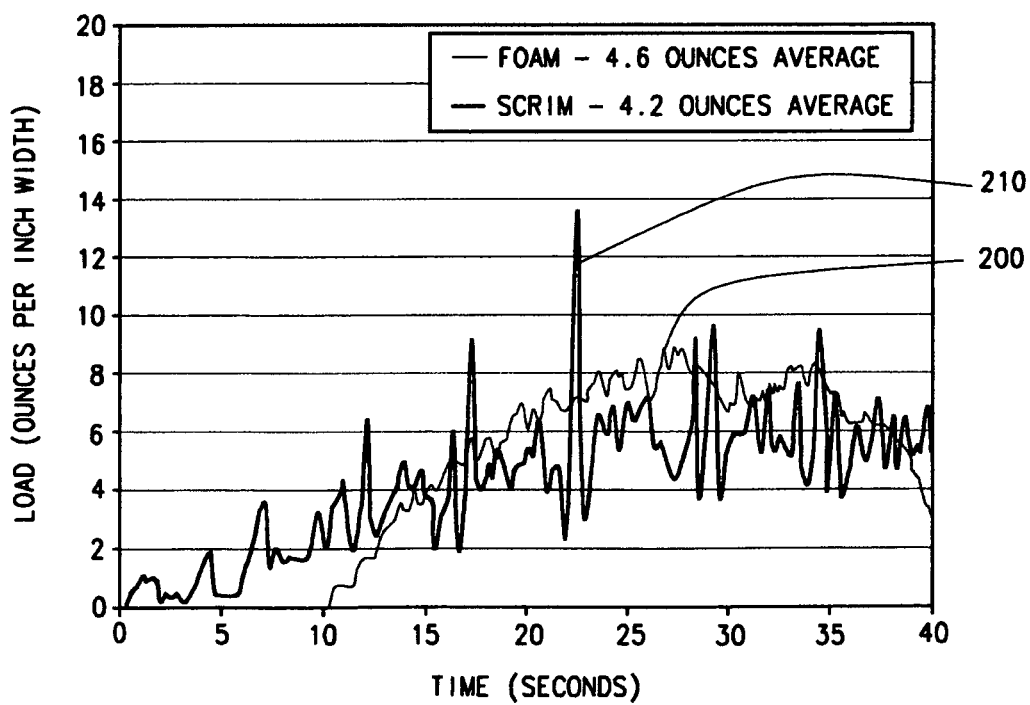
FIG. 2 is an exemplary line graph of load versus time showing bond strength of an adhesive that includes halogen-free flame retardant according to one exemplary embodiment of the present invention.

FIG. 2 illustrates the bonding strength of this particular adhesive (having about sixty-three percent by dry weight of a halogen-free phosphorous-based flame retardant) to the foam (represented by line 200) and to a polyester film scrim (represented by line 210) attached to the foam. As shown in FIG. 2, the average bonding strength between this particular adhesive and foam was about 4.6 ounces per inch width, and the average bonding strength between this particular adhesive and scrim was about 4.2 ounces per inch width. The desired bonding strength, however, can vary depending, for example, on the particular application in which the EMI shield will be used.

For another series of tests, the test specimens included a commercially available Woodbridge four pound per cubic foot density urethane foam 0.125 inches thick by 0.5 inches wide. This foam was made in a layer thickness of 3.0 millimeters, which is suitable for a UL sample. The test specimens further included an electrically conductive metallized fabric material that was again laminated to an adhesive layer. The adhesive layer included about sixty-three percent by dry weight of a halogen-free phosphorous-based flame retardant.

But unlike the above test specimens, the fabric was provided with a material (e.g., coating) that included halogen-free flame retardant and urethane such that the weight pick-up therefrom (from the material including the halogen-free flame retardant and urethane) was about 0.27 ounces per square yard (opsy). The halogen-free flame retardant was a water-based urethane dispersion (having about thirteen percent solids by weight) including about fifteen percent by weight of cyclic phosphonate esters with the remaining balance being de-ionized water. This phosphorous-based flame retardant liquid was then applied to the fabric by dipping the fabric into the flame retardant. The excess flame retardant was removed from the fabric (e.g., by squeezing the fabric with a pair of rubber nip rollers at about twenty pounds per square inch, etc.) and then drying the fabric in an oven when the oven temperature is at about three hundred twenty degrees Fahrenheit for twenty five minutes residence time in the oven. After drying, the flame retardant urethane coating included about fifty-four percent phosphorous-based flame retardant and about forty-six percent urethane.

In this particular embodiment, the fabric was laminated using a flat bed laminator set at about two hundred sixty degrees Fahrenheit at approximately fifteen feet per minute (although it may be laminated using other suitable means for achieving a desired adherence). The foam was joined together with the electrically conductive layer and the adhesive laminate using a series of heated dies to form the shield in the desired shape. Samples of this embodiment of a shield having dimensions of approximately 3.0 millimeters thick by 12.5 millimeters wide by 125 millimeters long were then tested per the UL94 flame rating of V0. The shield of this embodiment in which the fabric was provided with halogen-free flame retardant, in combination with an adhesive loaded with about sixty-three percent by dry weight of halogen-free flame retardant, met the UL94 flame rating as V0 as shown in Table 3 below.

TABLE 3

| Sample | T1 | T2 | T3 | Result |
|---|---|---|---|---|
| 1 | 6 | 0 | 1 | V0 |
| 2 | 5 | 0 | 1 | V0 |
| 3 | 6 | 1 | 1 | V0 |
| 4 | 5 | 0 | 0 | V0 |
| 5 | 5 | 0 | 1 | V0 |

Total Afterflame 28

For another series of tests, the test specimens included a commercially available Woodbridge four pound per cubic foot density urethane foam 0.125 inches thick by 0.5 inches wide. This foam was made in a layer thickness of 3.0 millimeters, which is suitable for a UL sample. The test specimens further included an electrically conductive metallized fabric material that was laminated to an adhesive layer. The adhesive layer included a polyester adhesive (e.g., 10-335 adhesive produced by Bostik, Inc., etc.) with about fifty percent by dry weight of a halogen-free phosphorous-based flame retardant.

The fabric was provided with a material (e.g., coating) that included halogen-free flame retardant and urethane such that the weight pick-up therefrom was about 0.27 ounces per square yard (opsy). In this particular embodiment, the halogen-free flame retardant was a water-based urethane dispersion (having about thirteen percent solids by weight) including about fifteen percent by weight of cyclic phosphonate esters with the remaining balance being de-ionized water. This phosphorous-based flame retardant liquid was applied to the metallized fabric layer by dipping the metallized fabric into the flame retardant. The excess flame retardant was removed from the metallized fabric (e.g., by squeezing the fabric with a pair of rubber nip rollers at twenty pounds per square inch, etc.) and then drying the metallized fabric in an oven when the oven temperature is at about three hundred twenty degrees Fahrenheit for twenty five minutes residence time in the oven. After drying, the flame retardant urethane coating included about fifty-four percent phosphorous-based flame retardant and about forty-six percent urethane.

In this particular embodiment, the fabric was laminated using a flat bed laminator set at about two hundred sixty degrees Fahrenheit at approximately fifteen feet per minute (although it may be laminated using other suitable means for achieving a desired adherence). The foam was joined together with the electrically conductive layer and the adhesive laminate using a series of heated dies to form the shield in the desired shape. Samples of this embodiment of a shield having dimensions of approximately 3.0 millimeters thick by 12.5 millimeters wide by 125 millimeters long were tested per the UL94 flame rating of V0. As shown in Table 4 below, the shield of this embodiment in which the fabric was provided with halogen-free flame retardant, in combination with an adhesive loaded with about fifty percent by dry weight of halogen-free flame retardant, met the UL94 flame ratings of V0.

TABLE 4

| Sample | T1 | T2 | T3 | Result |
|---|---|---|---|---|
| 1 | 5 | 2 | 1 | V0 |
| 2 | 5 | 0 | 1 | V0 |
| 3 | 4 | 0 | 1 | V0 |

TABLE 4-continued

| Sample | T1 | T2 | T3 | Result |
|---|---|---|---|---|
| 4 | 5 | 1 | 1 | V0 |
| 5 | 5 | 0 | 1 | V0 |

Total Afterflame 27

FIG. 3 illustrates the bonding strength of this particular adhesive (having about fifty percent by dry weight of halogen-free phosphorous-based flame retardant) to the foam (represented by line 300) and to a polyester film scrim (represented by line 310) attached to the foam. As shown in FIG. 3, the bonding strength between this particular adhesive and foam was sufficiently strong to tear the foam, and the average bonding strength between this particular adhesive and scrim was about 55.3 ounces per inch width. The desired bonding strength, however, can vary depending, for example, on the particular application in which the EMI shield will be used.

In the latter two tests described above, the fabric was provided with halogen-free flame retardant urethane such that the weight pick-up therefrom was about 0.27 ounces per square yard (opsy). In other embodiments, however, the electrically conductive fabric (e.g., nylon ripstop (NRS) fabrics, mesh fabrics, taffeta fabrics, woven fabrics, non-woven fabrics, knitted fabrics, etc.) can be provided with (e.g., coated, impregnated, combinations thereof, etc.) a different amount of halogen-free flame retardant. Various embodiments include an electrically conductive fabric provided with halogen-free flame retardant urethane (e.g., coating, etc.) such that the weight pick-up therefrom is between about 0.16 opsy and about 0.33 opsy (e.g., about 0.16 opsy, about 0.20 opsy, about 0.26 opsy, about 0.27 opsy, about 0.33 opsy, etc.).

In various embodiments, an electrically conductive fabric includes a halogen-free flame retardant urethane coating having a thickness of about one micron or less. In such embodiments, the thickness of the halogen-free flame retardant urethane coating can vary across the surface of the fabric. Alternatively, the thickness of the halogen-free flame retardant urethane coating can be substantially uniform across the surface of the fabric. To help maintain electrical conductivity, the fabric in various embodiments is not entirely permeated or encapsulated with flame retardant urethane.

In some embodiments, the electrically conductive fabric may be provided with a halogen-free corrosion inhibitor (e.g., benzotriazole, or other suitable corrosion inhibitor, for example, selected from the azole family and/or pyrole family, etc.). Depending on the particular corrosion inhibitor used, the corrosion inhibitor may function as a halogen-free flame retardant. In such embodiments, the corrosion inhibitor may thus be referred to herein as a halogen-free flame retardant. In yet other embodiments, the electrically conductive fabric is provided (e.g., coated, etc.) with both a corrosion inhibitor and flame retardant.

In still other embodiments, the electrically conductive fabric is provided (e.g., coated, etc.) with a material that does not include any halogen-free flame retardant. For example, in the test first described above, the electrically conductive layer was provided with a Non-FR urethane coating having about eighteen percent urethane solids such that the weight pick-up from the Non-FR urethane coating was about 0.15 opsy. Yet other embodiments include an electrically conductive fabric provided with Non-FR urethane (e.g., coating, etc.) having about ten percent to about eighteen percent urethane solids such that the weight pick-up on the fabric is between about 0.05 opsy and about 0.35 opsy (e.g., about 0.05 opsy, about 0.15 opsy, about 0.35 opsy, etc.).

By way of example, FIG. 4 lists three exemplary materials (NRS, mesh, and taffeta) that are used in various embodiments of the invention. Any one of the fabrics listed in FIG. 4 can be bonded to a resilient core member (e.g., urethane foam, etc.) with an adhesive that includes halogen-free flame retardant, thereby forming an EMI shield according to various embodiments of the invention. FIG. 4 also provides surface resistivity of these exemplary fabrics when uncoated and when coated with halogen-free flame retardant urethane. As shown in FIG. 4, the coated and uncoated fabrics all have a surface resistivity of less than 0.10 ohms/sq. In addition, FIG. 4 also indicates that some of the coated fabrics achieve a UL rating of HB, such as the coated NRS.

While the halogen-free flame retardant provided to the fabrics in FIG. 4 was not enough to significantly increase surface resistivity, it was a sufficient amount so as to allow the adhesive to be loaded with less halogen-free flame retardant in order to obtain a higher adhesive bond strength and also achieve a UL94 flame rating of V0 for the overall EMI shield product. Alternatively, other flame retardants, other amounts of flame retardants, and other materials besides the fabrics shown in FIG. 4 can be used for an EMI shield of the present invention.

In some embodiments, the halogen-free flame retardant urethane provided (e.g., applied, coated, impregnated, combinations thereof, etc.) to the electrically conductive portion is formed, for example, by combining together while substantially continuously, vigorously mixing in the following exemplary ratio and order about thirty-five percent by weight of Soluol 1024 water-based urethane dispersion (having about thirty-seven percent solids) including about fifty percent by weight of de-ionized water and about fifteen percent by weight of phosphorous-based flame retardant. The resulting flame retardant urethane includes about twenty-nine percent solids and has a viscosity of about twenty centipoise per second (cps). Accordingly, and after drying in this particular embodiment, the halogen-free flame retardant urethane provided to the electrically conductive portion includes about forty-six percent by dry weight of urethane and about fifty-four percent by dry weight of flame retardant. In another embodiment, however, the electrically conductive portion is provided (e.g., applied, coated, impregnated, combinations thereof, etc.) with a halogen-free flame retardant urethane that includes about fifty-two percent by dry weight of halogen-free flame retardant and about of about forty-eight by dry weight of urethane. Exemplary phosphorous-based flame retardants that can be used include cyclic phosphonate ester blends available from Sovereign Specialty Chemicals, Inc. of Chicago, Ill. and/or from AKSO Nobel Phosphorous Chemicals, Inc. of Dobbs Ferry, N.Y. Alternatively, other suitable flame retardants can be used including mineral oxides (e.g., magnesium hydroxide, antimony oxide, etc.), metal hydrates (e.g., aluminum trihydrate, etc.) boron compounds (e.g., boric acid, borax, etc.), melamines, silicones, among others.

In various embodiments, the resilient core member (e.g., urethane foam, etc.) is also provided with flame retardant. For example, various embodiments include a resilient core member provided (e.g., impregnated with, etc.) with an antimony flame retardant such that the resilient core member is able to achieve a UL rating of HF1.

Accordingly, various EMI shields of the present invention include a core member, an electrically conductive portion, and an adhesive bonding the electrically conductive portion to the core member, wherein the core member, the electrically conductive portion, and the adhesive are each provided with (e.g., coated, impregnated, combination thereof, etc.) a flame retardant. In these embodiments, the flame retardant applied to the electrically conductive portion can be a corrosion inhibitor, such as benzotriazole or other suitable corrosion inhibitor, for example, selected from the azole family and/or pyrole family, etc.

Figures 5, 6:
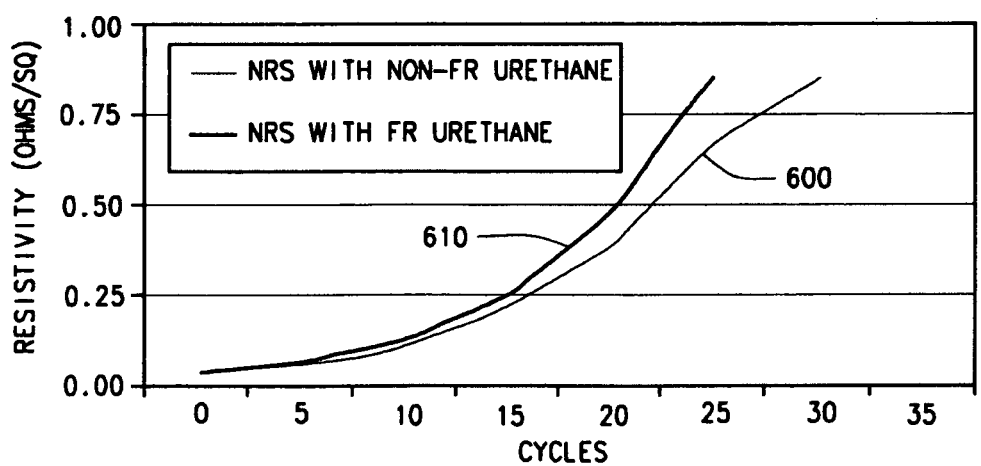
FIG. 5 is a table summarizing data collected during crush and fold testing of a nylon ripstop (NRS) fabric coated with urethane, and a NRS fabric coated with halogen-free flame retardant urethane according to one exemplary embodiment of the present invention.
FIG. 6 is an exemplary line graph created with data from the table shown in FIG. 5 and illustrating surface resistivity versus number of cycles during the crush and fold testing.

FIG. 5 is a table of data collected during crush and fold testing of a nylon ripstop (NRS) fabric coated with urethane that did not include flame retardant (Non-FR urethane), and a NRS fabric coated with halogen-free flame retardant urethane (FR urethane). For this particular example, the first NRS fabric was provided with an amount of Non-FR urethane such that the weight pick-up therefrom was about 0.23 opsy, and the other NRS fabric was provided with an amount of FR urethane such that the weight pick-up therefrom was about 0.27 opsy. Generally, crush and fold tests measure abuse resistance of a plated metal fabric by folding and crumpling the fabric. In this particular example, the NRS fabric coated with Non-FR urethane and the NRS fabric coated with halogen-free flame retardant urethane were both tested for shielding effectiveness between five and one thousand megahertz and for surface resistivity. The fabrics were then folded in quarters, rolled into a cylinder, and crushed in a ten milliliter syringe using a five pound weight. The testing was repeated until the average shielding effectiveness dropped below sixty decibels across the frequency range.

FIG. 6 is an exemplary line graph created from the surface resistivity data shown in FIG. 5. In FIG. 6, line 600 represents surface resistivity for the NRS fabric coated with Non-FR urethane, and line 610 represents surface resistivity for the NRS fabric coated with halogen-free flame retardant urethane.

Figure 7:
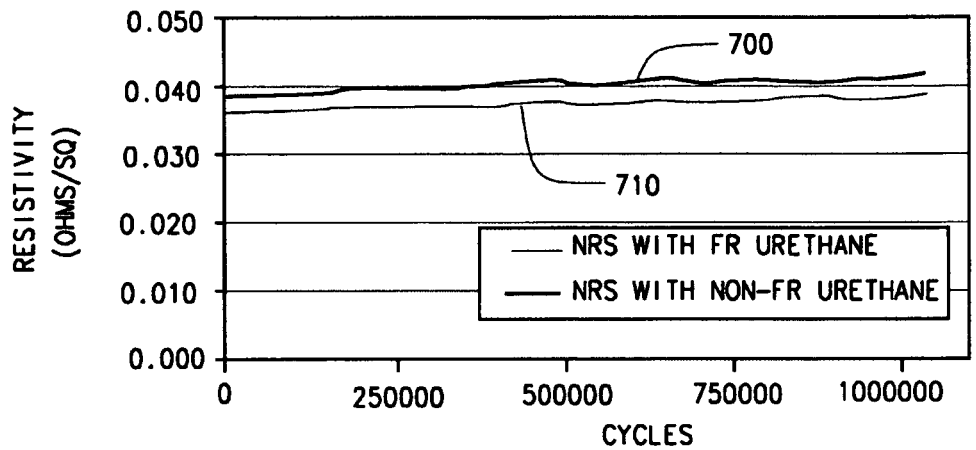
FIG. 7 is an exemplary line graph of surface resistivity versus number of cycles during inflated diaphragm abrasion testing of a NRS fabric coated with urethane, and a NRS fabric coated with halogen-free flame retardant urethane according to one exemplary embodiment of the present invention.

FIG. 7 is an exemplary line graph showing surface resistivity versus number of cycles during inflated diaphragm abrasion testing of NRS fabric coated with an amount of Non-FR urethane such that the weight pick-up therefrom was about 0.23 opsy, and a NRS fabric coated with an amount of halogen-free flame retardant urethane such that the weight pick-up therefrom was about 0.27 opsy. In FIG. 7, line 700 represents surface resistivity for the NRS fabric coated with Non-FR urethane, and line 710 represents surface resistivity for the NRS fabric coated with halogen-free flame retardant urethane.

Figure 8:
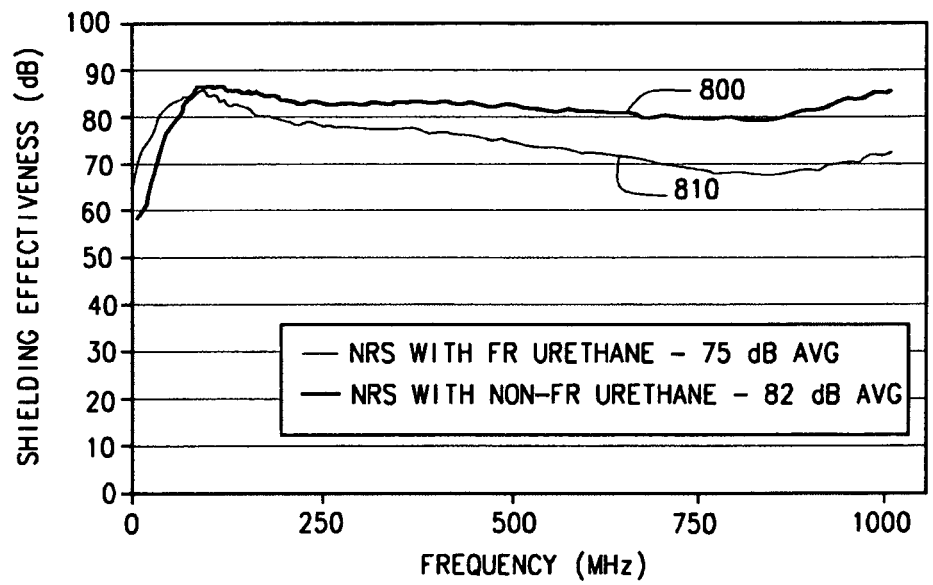
FIG. 8 is an exemplary line graph of shielding effectiveness versus frequency for a NRS fabric coated with urethane, and a NRS fabric coated with halogen-free flame retardant urethane according to one exemplary embodiment of the present invention.

FIG. 8 is an exemplary line graph of shielding effectiveness (in decibels) versus electromagnetic interference frequency (in megahertz) for a nickel copper NRS fabric coated with an amount of Non-FR urethane such that the weight pick-up therefrom was about 0.23 opsy, and a nickel copper NRS fabric coated with halogen-free flame retardant urethane such that the weight pick-up therefrom was 0.27 opsy. In FIG. 8, line 800 represents shielding effectiveness for the NRS fabric coated with Non-FR urethane, and line 810 represents shielding effectiveness for the NRS fabric coated with halogen-free flame retardant urethane. As noted in FIG. 8, the NRS fabric coated with Non-FR urethane had an average shielding effectiveness of about eighty two decibels across the frequency range of five to one thousand megahertz. The NRS fabric coated with halogen-free flame retardant urethane had an average shielding effectiveness of about seventy five decibels across the frequency range of five to one thousand megahertz.

Figure 9:
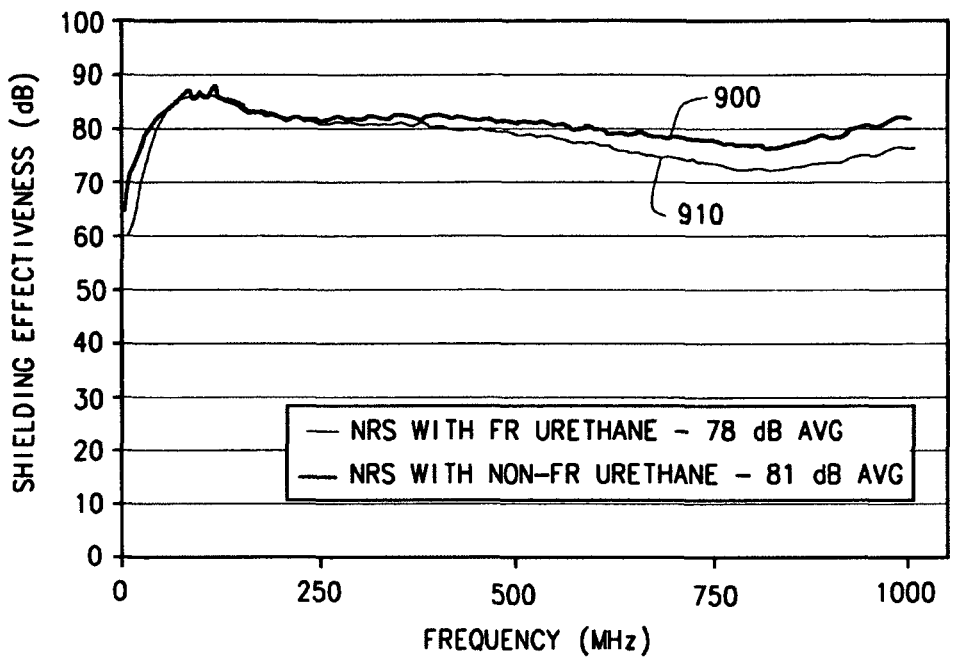
FIG. 9 is an exemplary line graph of shielding effectiveness versus frequency for the NRS fabrics shown in FIG. 8 after one week of exposure at sixty degrees Celsius and ninety percent relative humidity.

FIG. 9 is an exemplary line graph of shielding effectiveness (in decibels) versus electromagnetic interference frequency (in megahertz) for the nickel copper NRS fabrics shown in FIG. 8 but after one week of environmental exposure within a humidity and temperature chamber at sixty degrees Celsius and ninety percent relative humidity. In FIG. 9, line 900 represents shielding effectiveness for the NRS fabric coated with Non-FR urethane, and line 910 represents shielding effectiveness for the NRS fabric coated with halogen-free flame retardant urethane. As noted in FIG. 9, the NRS fabric coated with Non-FR urethane had an average shielding effectiveness of about eighty one decibels across the frequency range of five to one thousand megahertz. The NRS fabric coated with halogen-free flame retardant urethane had an average shielding effectiveness of about seventy eight decibels across the frequency range of five to one thousand megahertz.

Figure 10:
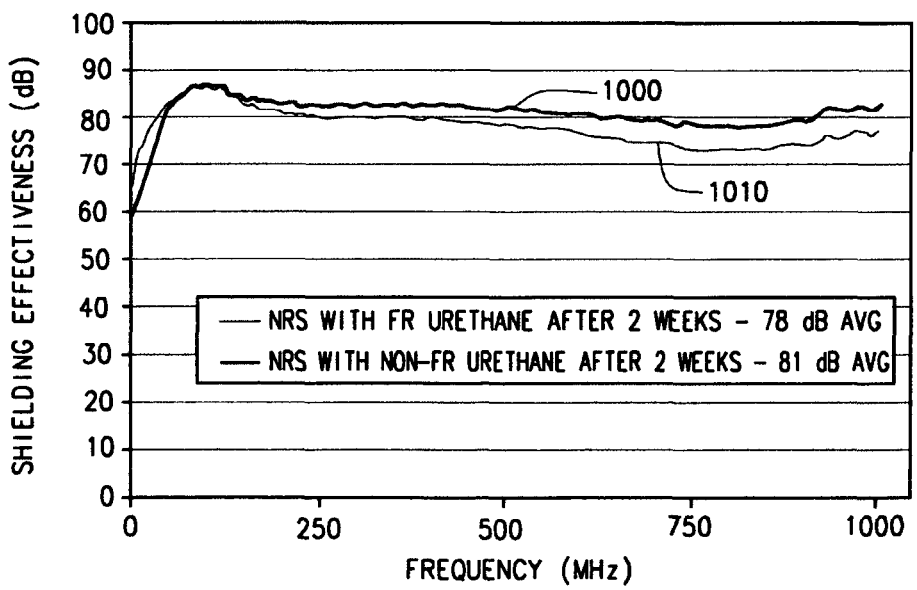
FIG. 10 is another exemplary line graph of shielding effectiveness versus frequency for the NRS fabrics shown in FIGS. 8 and 9 after two weeks of exposure at sixty degrees Celsius and ninety percent relative humidity.

FIG. 10 is another exemplary line graph of shielding effectiveness (in decibels) versus electromagnetic interference frequency (in megahertz) for the nickel copper NRS fabrics shown in FIGS. 8 and 9 but after two weeks of environmental exposure within a humidity and temperature chamber at sixty degrees Celsius and ninety percent relative humidity. In FIG. 10, line 1000 represents shielding effectiveness for the NRS fabric coated with Non-FR urethane, and line 1010 represents shielding effectiveness for the NRS fabric coated with halogen-free flame retardant urethane. As noted in FIG. 10, the NRS fabric coated with Non-FR urethane had an average shielding effectiveness of about eighty one decibels across the frequency range of five to one thousand megahertz. The NRS fabric coated with halogen-free flame retardant urethane had an average shielding effectiveness of about seventy eight decibels across the frequency range of five to one thousand megahertz.

Figure 11:
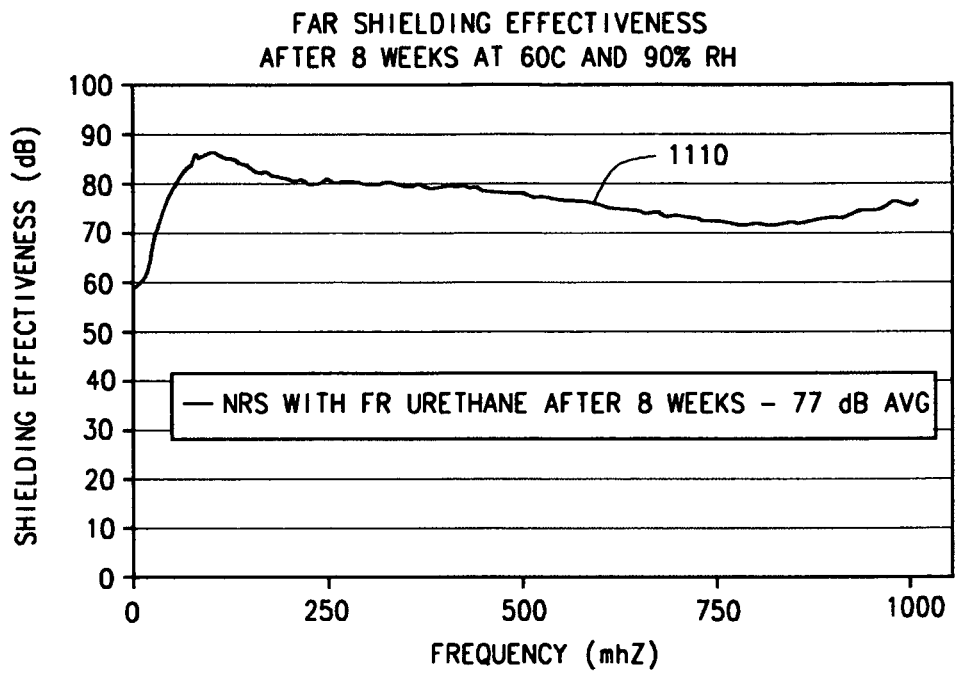
FIG. 11 is another exemplary line graph of shielding effectiveness versus frequency for the NRS fabric coated with halogen-free flame retardant urethane shown in FIGS. 8-10 after eight weeks of exposure at sixty degrees Celsius and ninety percent relative humidity.

FIG. 11 is another exemplary line graph of shielding effectiveness versus electromagnetic interference frequency for the nickel copper NRS fabric coated with the FR urethane shown in FIGS. 8-10 but after eight weeks of environmental exposure within a humidity and temperature chamber at sixty degrees Celsius and ninety percent relative humidity. In FIG. 11, the line 1110 represents shielding effectiveness for the NRS fabric coated with halogen-free flame retardant urethane. As noted in FIG. 11, the NRS fabric coated with halogen-free flame retardant urethane had an average shielding effectiveness of about seventy seven decibels across the frequency range of five to one thousand megahertz.

In various embodiments, an EMI shield generally includes a resilient core member and an electrically conductive layer. In these particular embodiments, the electrically conductive layer is bonded to the core member with an adhesive layer having a thickness of about 0.0025. The adhesive layer is formed from 10-336 adhesive sold by Bostik, Inc. The inventor hereof has recognized that with this particular adhesive, the EMI shield can achieve a UL94 flame rating of V0 without any flame retardant being provided to the electrically conductive layer. For example, the electrically conductive layer in one embodiment includes a Non-FR urethane coating having about eighteen percent urethane solids such that the weight pick-up from the Non-FR urethane coating was about 0.15 opsy. Yet other embodiments include an electrically conductive layer provided with Non-FR urethane (e.g., coating, etc.) having about ten percent to about eighteen percent urethane solids such that the weight pick-up on the fabric is between about 0.05 opsy and about 0.35 opsy (e.g., about 0.05 opsy, about 0.15 opsy, about 0.35 opsy, etc.).

In further embodiments, an EMI shield generally includes a resilient core member and an electrically conductive layer. An adhesive, which include halogen-free flame retardant, bonds the electrically conductive layer to the core member. In these particular embodiments, the electrically conductive layer is provided with (e.g., coated, impregnated, combinations thereof, etc.) a halogen-free corrosion inhibitor (e.g., benzotriazole, or other suitable corrosion inhibitor, for example, selected from the azole family and/or pyrole family, etc.). Depending on the particular corrosion inhibitor used, the corrosion inhibitor may function as a halogen-free flame retardant, in which case, the corrosion inhibitor may thus be referred to herein as a halogen-free flame retardant. This corrosion inhibitor can be added to a urethane coating, which is applied to the electrically conductive layer. The inventor hereof has recognized that when halogen-free EMI shields are exposed to high temperature and humidity (e.g., sixty degrees Celsius or higher temperatures, ninety percent relative humidity or higher) for several days, a small amount of corrosion may form when the EMI shields are in contact with certain metals. Adding a corrosion inhibitor to the EMI shield can greatly improve the corrosion resistance of the halogen-free EMI shield in a high temperature and high humidity environment. In various embodiments, the electrically conductive layer of the EMI shield is provided with (e.g., coated, impregnated, combinations thereof, etc.) urethane that includes a corrosion inhibitor additive to thereby help protect the EMI shield from corrosion in high temperature and humidity applications. In one embodiment of a halogen-free EMI shield, the electrically conductive layer is provided or coated with liquid urethane having an amount of Benzotriazole corrosion inhibitor of at least about two percent by liquid weight. In another embodiment of a halogen-free EMI shield, the electrically conductive layer is provided or coated with liquid urethane having an amount of Benzotriazole corrosion inhibitor of at least about one percent by liquid weight. In a further embodiment of a halogen-free EMI shield, the electrically conductive layer is provided or coated with a dry urethane film having an amount of Benzotriazole corrosion inhibitor of at least about four percent by dry weight. Alternatively, other suitable corrosion inhibitors and/or in other amounts can be used depending on the particular application in which the EMI shield will be used.

Accordingly, various embodiments of the present invention include fabric-over-foam EMI shields that are formed from environmentally friendly retardants (e.g., halogen-free flame retardants, etc.) and still are able achieve a UL flame rating of V0 while also having a bond strength of at least ten ounces per inch width (e.g., as determined by standard testing, for example, such as a one hundred eighty degree peel at twelve inches per minute, etc.) to a foam and a scrim attached to the foam and retaining properties suitable (e.g., shielding effectiveness, bulk resistivity, etc.) for EMI shielding applications.

The teachings of the present invention can be applied in a wide range of applications. Accordingly, the specific references to electromagnetic interference shielding applications should not be construed as limiting the scope of the present invention to use in only electromagnetic interference shielding applications.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An electromagnetic interference (EMI) shield comprising at least one resilient core member, at least one electrically conductive layer, and at least one adhesive bonding the electrically conductive layer to the resilient core member with a bond strength of at least ten ounces per inch width, the adhesive being free of halogen and including 25 percent or more by dry weight of at least one halogen-free flame retardant, the shield having a flame rating of V0 under Underwriter's Laboratories (UL) Standard No. 94, wherein the electrically conductive layer comprises at least one fabric material, and wherein the resilient core member comprises at least one urethane foam material that is free of flame retardant.

2. The shield of claim 1, wherein the adhesive includes about 50 percent or more by dry weight of halogen-free flame retardant.

3. The shield of claim 2, wherein the adhesive includes between about 50 percent and about 70 percent by dry weight of halogen-free flame retardant.

4. The shield of claim 3, wherein the adhesive includes about fifty percent by dry weight of halogen-free flame retardant.

5. The shield of claim 3, wherein the adhesive includes about sixty-three percent by dry weight of halogen-free flame retardant.

6. The shield of claim 3, wherein the adhesive includes about fifty-five percent by dry weight of halogen-free flame retardant.

7. The shield of claim 1, wherein the amount of halogen-free flame retardant within the adhesive is within a range of about fifty percent to sixty-three percent by dry weight of halogen-free flame retardant.

8. The shield of claim 1, wherein the adhesive includes at least one halogen-free phosphorous-based flame retardant.

9. The shield of claim 1, further comprising halogen-free flame retardant and urethane provided to the electrically conductive layer, and wherein the weight pick-up from the halogen-free flame retardant and urethane is between about 0.16 ounces per square yard and about 0.33 ounces per square yard.

10. The shield of claim 1, further comprising halogen-free flame retardant provided to the electrically conductive layer, and that comprises about fifty-four percent by dry weight of a phosphorous-based flame retardant and about forty-six percent by dry weight of urethane.

11. The shield of claim 1, further comprising halogen-free flame retardant and urethane provided to the electrically conductive layer, and wherein the weight pick-up from the halogen-free flame retardant and urethane is about 0.27 ounces per square yard.

12. The shield of claim 1, further comprising halogen-free flame retardant provided to the electrically conductive layer, the halogen-free flame retardant comprising urethane and a corrosion inhibitor, and wherein the weight pick-up from the halogen-free flame retardant including the urethane and the corrosion inhibitor is between about 0.05 ounces per square yard and about 0.35 ounces per square yard.

13. The shield of claim 1, further comprising halogen-free flame retardant provided to the electrically conductive layer, the halogen-free flame retardant comprising urethane and a corrosion inhibitor, and wherein the weight pick-up from the halogen-free flame retardant including the urethane and the corrosion inhibitor is about 0.15 ounces per square yard.

14. The shield of claim 1, further comprising halogen-free flame retardant provided to the electrically conductive layer, the halogen-free flame retardant comprising about four percent by dry weight of a corrosion inhibitor and about ninety-six percent by dry weight of urethane.

15. The shield of claim 1, further comprising halogen-free flame retardant provided to the electrically conductive layer, and wherein the electrically conductive layer has a surface resistivity of less than 0.1 ohms/sq.

16. The shield of claim 1, further comprising halogen-free flame retardant provided to the electrically conductive layer.

17. The shield of claim 1, wherein the adhesive comprises between 25 percent and about 70 percent by dry weight of halogen-free flame retardant.

18. The shield of claim 1, wherein the shield has only three layers, consisting only of:
a first layer that includes the at least one resilient core member; and
a second layer that includes the at least one adhesive having the halogen-free flame retardant; and
a third layer that includes the at least one electrically conductive layer.

19. The shield of claim 18, wherein the at least one electrically conductive layer includes a urethane coating.

20. The shield of claim 1, wherein:
the at least one urethane foam material comprises polyurethane foam;
the at least one adhesive comprises at least one halogen-free phosphorus-based flame retardant, and a polyester adhesive layer which includes the halogen-free phosphorus-based flame retardant; and
the at least one fabric material comprises a metalized fabric laminated to the polyester adhesive layer.

21. A fabric-over-foam electromagnetic interference (EMI) shielding gasket comprising at least one resilient core member, at least one electrically conductive layer, and at least one adhesive bonding the electrically conductive layer to the resilient core member, the adhesive being free of halogen and including an amount of halogen-free flame retardant within a range of about fifty percent to about seventy percent by dry weight, the shield having a flame rating of V0 under Underwriter's Laboratories (UL) Standard No. 94, wherein the adhesive bonds the electrical conductive layer to the resilient core member with a bond strength of at least ten ounces per inch width, wherein the electrically conductive layer comprises at least one fabric material, and wherein the resilient core member comprises at least one urethane foam material that is free of flame retardant.

22. The gasket of claim 21, wherein the adhesive includes about fifty percent by dry weight of halogen-free flame retardant.

23. The gasket of claim 21, further comprising halogen-free flame retardant provided to the electrically conductive layer.

24. The gasket of claim 23, wherein the halogen-free flame retardant provided to the electrically conductive layer is a corrosion inhibitor.

25. The shield of claim 21, wherein the shield has only three layers, consisting only of:
a first layer that includes the at least one resilient core member; and
a second layer that includes the at least one adhesive having the halogen-free flame retardant; and
a third layer that includes the at least one electrically conductive layer.

26. The shield of claim 25, wherein the at least one electrically conductive layer includes a urethane coating.

27. The gasket of claim 21, wherein:
the at least one urethane foam material comprises polyurethane foam;
the at least one adhesive comprises at least one halogen-free phosphorus-based flame retardant, and a polyester adhesive layer which includes the halogen-free phosphorus-based flame retardant; and
the at least one fabric material comprises a metalized fabric laminated to the polyester adhesive layer.

28. An electromagnetic interference (EMI) shield comprising at least one resilient core member, at least one electrically conductive layer, and at least one adhesive bonding the electrically conductive layer to the resilient core member with a bond strength of at least 10 ounces per inch width, wherein the adhesive is free of halogen and includes an amount of halogen-free flame retardant that is not more than 70 percent by dry weight, the shield having a flame rating of V0 under Underwriter's Laboratories (UL) Standard No. 94, wherein the electrically conductive layer comprises at least one fabric material, and wherein the resilient core member comprises at least one urethane foam material that is free of flame retardant.

29. The shield of claim 28, further comprising halogen-free flame retardant provided to the electrically conductive layer.

30. The shield of claim 28, wherein the shield has only three layers, consisting only of:
a first layer that includes the at least one resilient core member; and
a second layer that includes the at least one adhesive having the halogen-free flame retardant; and
a third layer that includes the at least one electrically conductive layer.

31. The shield of claim 30, wherein the at least one electrically conductive layer includes a urethane coating.

32. The shield of claim 28, wherein:
the at least one urethane foam material comprises polyurethane foam;
the at least one adhesive comprises at least one halogen-free phosphorus-based flame retardant, and a polyester adhesive layer which includes the halogen-free phosphorus-based flame retardant; and
the at least one fabric material comprises a metalized fabric laminated to the polyester adhesive layer.

33. An electromagnetic interference (EMI) shield comprising at least one resilient core member, at least one electrically conductive layer, and at least one adhesive bonding the electrically conductive layer to the resilient core member, the adhesive being free of halogen and including halogen-free flame retardant in an amount within a range of about 50 percent by dry weight and about 63 percent by dry weight, such that the shield has a flame rating of V0 under Underwriter's Laboratories (UL) Standard No. 94, and such that the adhesive has a bond strength of at least 10 ounces per inch width, and wherein the electrically conductive layer comprises at least one fabric material, and wherein the resilient core member comprises at least one urethane foam material that is free of flame retardant.

34. The shield of claim 33, wherein the shield is substantially free of halogen.

35. The shield of claim 33, wherein the shield is entirely free of halogen.

36. An electronic device including the shield of claim 33.

37. The shield of claim 33, wherein the shield has only three layers, consisting only of:
a first layer that includes the at least one resilient core member; and
a second layer that includes the at least one adhesive having the halogen-free flame retardant; and
a third layer that includes the at least one electrically conductive layer.

38. The shield of claim 37, wherein the at least one electrically conductive layer includes a urethane coating.

39. The shield of claim 33, wherein:
the at least one urethane foam material comprises polyurethane foam;
the at least one adhesive comprises at least one halogen-free phosphorus-based flame retardant, and a polyester adhesive layer which includes the halogen-free phosphorus-based flame retardant; and
the at least one fabric material comprises a metalized fabric laminated to the polyester adhesive layer.

* * * * *